(12) United States Patent
Lefevre et al.

(10) Patent No.: US 6,560,249 B1
(45) Date of Patent: May 6, 2003

(54) LASER SOURCE WITH INTEGRAL FILTERING OF THE AMPLIFIED SPONTANEOUS EMISSION

(75) Inventors: Hervé Lefevre, Paris (FR); Philippe Graindorge, Chevigny Saint Sauveur (FR)

(73) Assignee: Photonetics, Marly de Roi (FR)

(*) Notice: Subject to any disclaimer, the term of this patent is extended or adjusted under 35 U.S.C. 154(b) by 182 days.

(21) Appl. No.: 09/605,532

(22) Filed: Jun. 29, 2000

(30) Foreign Application Priority Data

Jun. 30, 1999 (FR) ............................. 99 08398

(51) Int. Cl.[7] ............................................... H01S 3/10
(52) U.S. Cl. ..................... 372/20; 372/102; 372/99; 372/32; 372/98
(58) Field of Search .................. 372/20, 32, 99, 372/102, 92

(56) References Cited

U.S. PATENT DOCUMENTS

| | | | | |
|---|---|---|---|---|
| 5,400,350 A | * | 3/1995 | Galvanauskas | 372/20 |
| 5,594,744 A | * | 1/1997 | Lefevre | 372/20 |
| 5,886,785 A | * | 3/1999 | Lefevre | 356/328 |
| 6,177,992 B1 | * | 1/2001 | Braun | 356/327 |
| 6,256,328 B1 | * | 7/2001 | Delfyett | 372/23 |

FOREIGN PATENT DOCUMENTS

| | | |
|---|---|---|
| EP | 0718936 | 6/1996 |
| EP | 0917261 | 5/1999 |
| FR | 2595013 | 8/1987 |

OTHER PUBLICATIONS

Claps R. et al.: "Raman Spectroscopy with a Single-Frequency, High-Power, Broad-Area Laser Diode" *Applied Spectroscopy*, U.S., The Society for Applied Spectroscopy, Baltimore, vol. 53, No. 5, May 1999, pp. 491–496.

* cited by examiner

*Primary Examiner*—Leon Scott, Jr.
(74) *Attorney, Agent, or Firm*—Arent Fox Kintner Plotkin & Kahn

(57) ABSTRACT

Laser source comprising a first active arm extending from a first end reflector up to a dispersing system grid and containing an amplifier medium that produces a first luminous beam. A second passive arm extends from the grid to a second end reflector, the grid generating a second beam by diffraction of the first beam, wherein the second end reflector closes the second passive arm and is partially reflecting to enable extraction of a luminous flux. An optical component produces, from the second beam, a third beam translated and antiparallel, to return to the grid which, by diffraction, forms a fourth beam translated and antiparallel to the first beam.

21 Claims, 6 Drawing Sheets

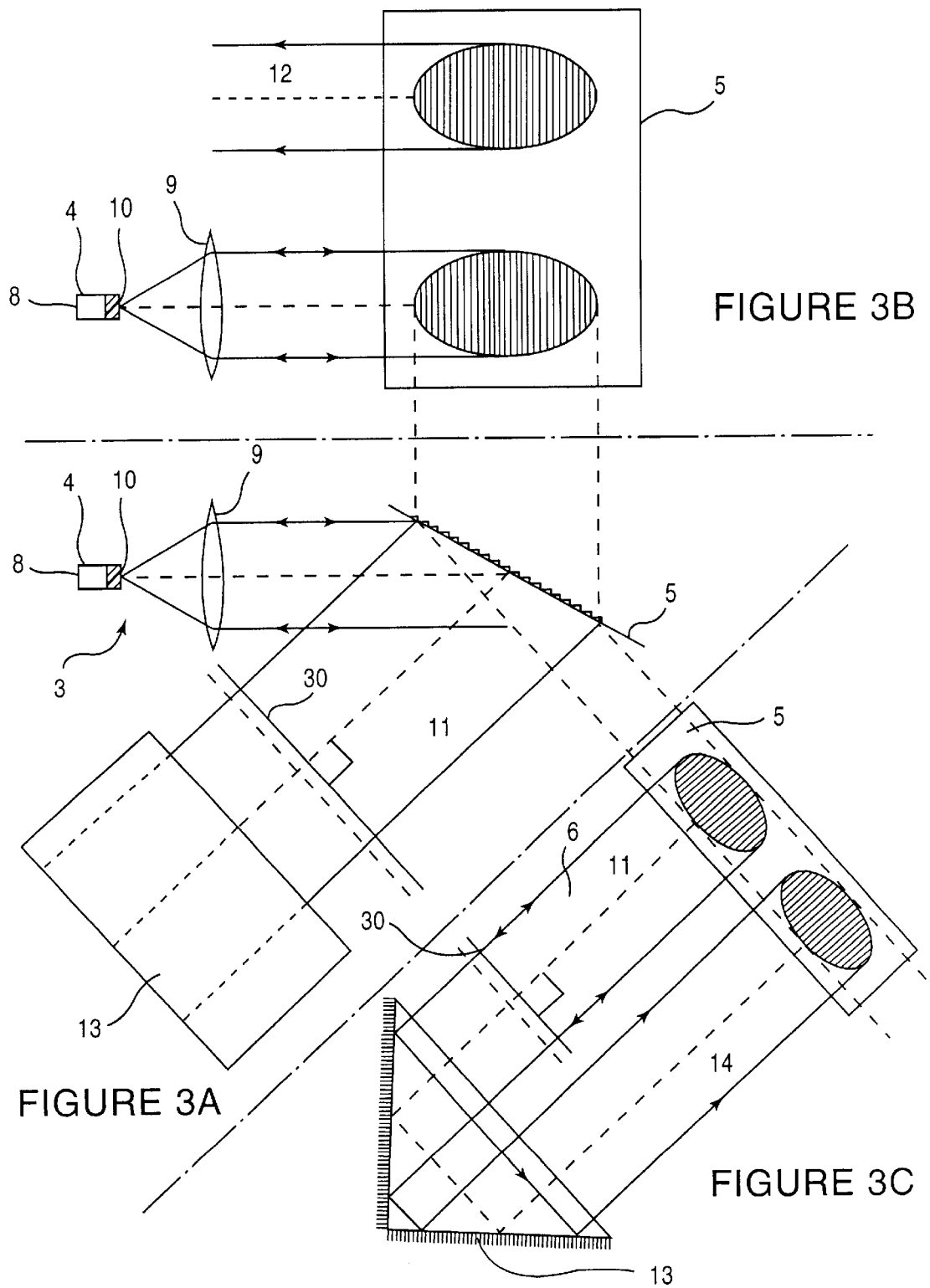

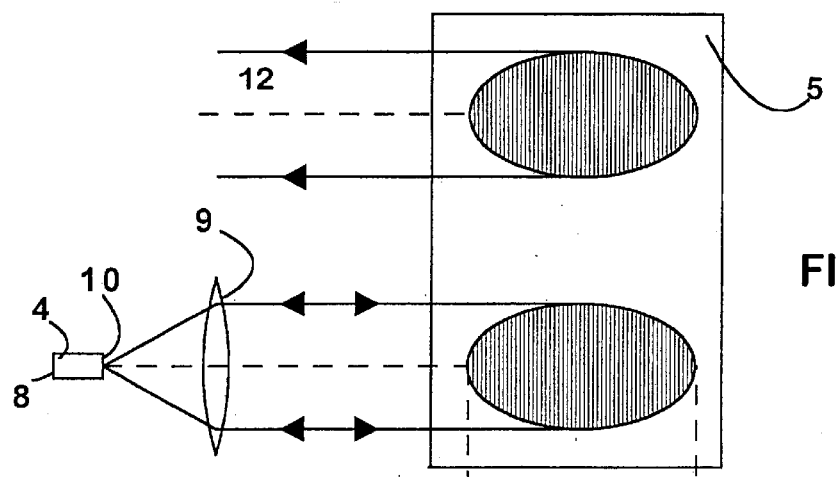
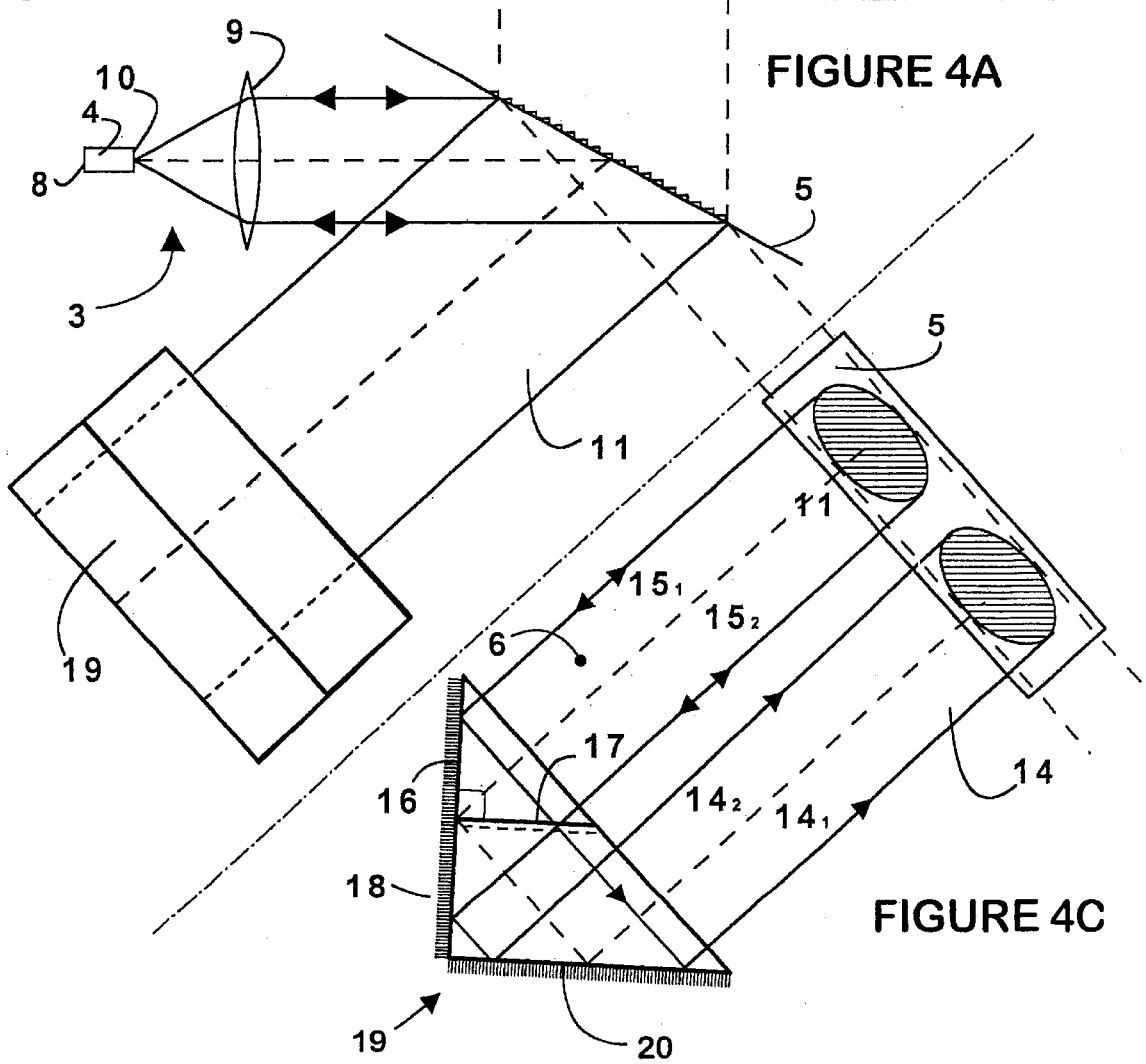

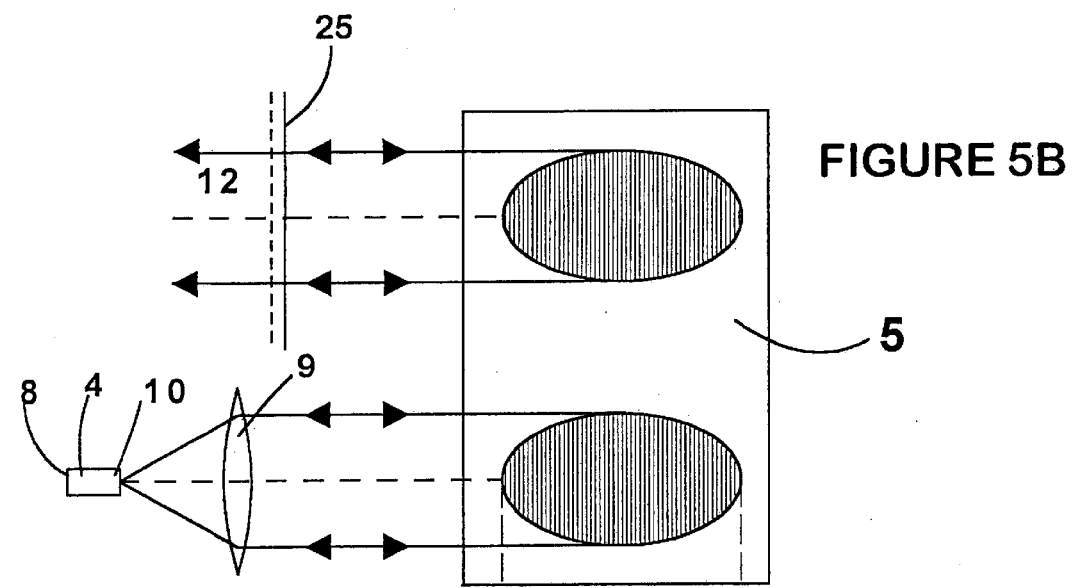
FIGURE 5B
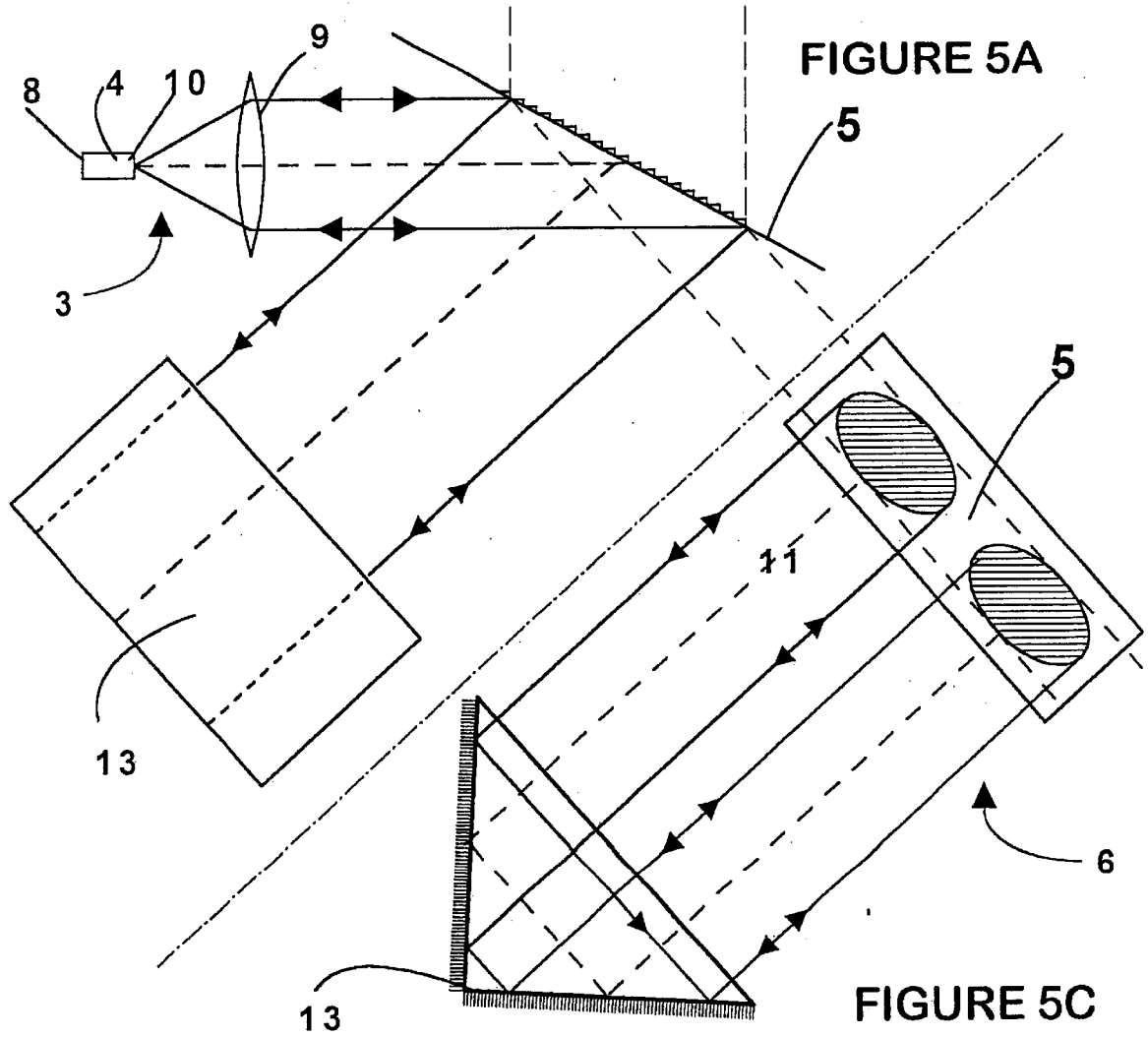
FIGURE 5A
FIGURE 5C

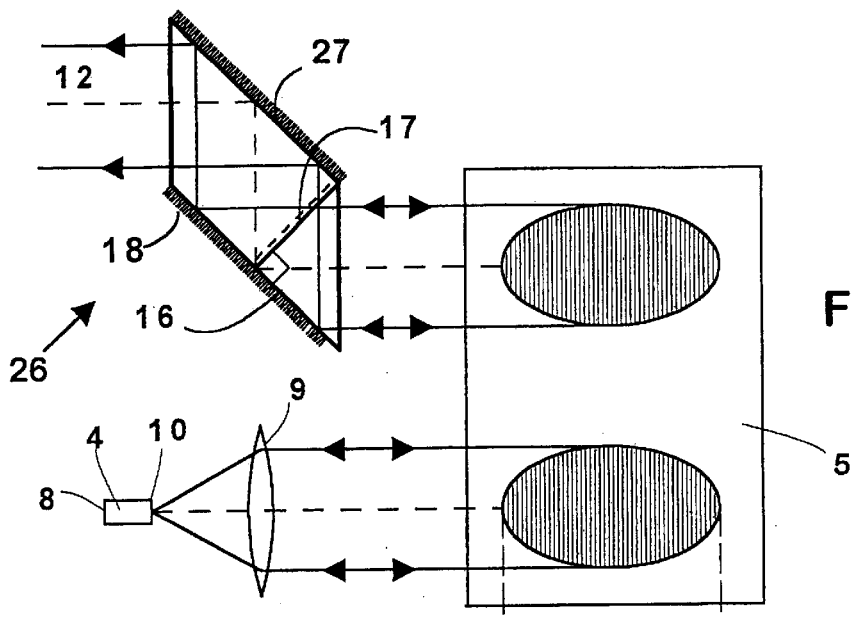
FIGURE 6B
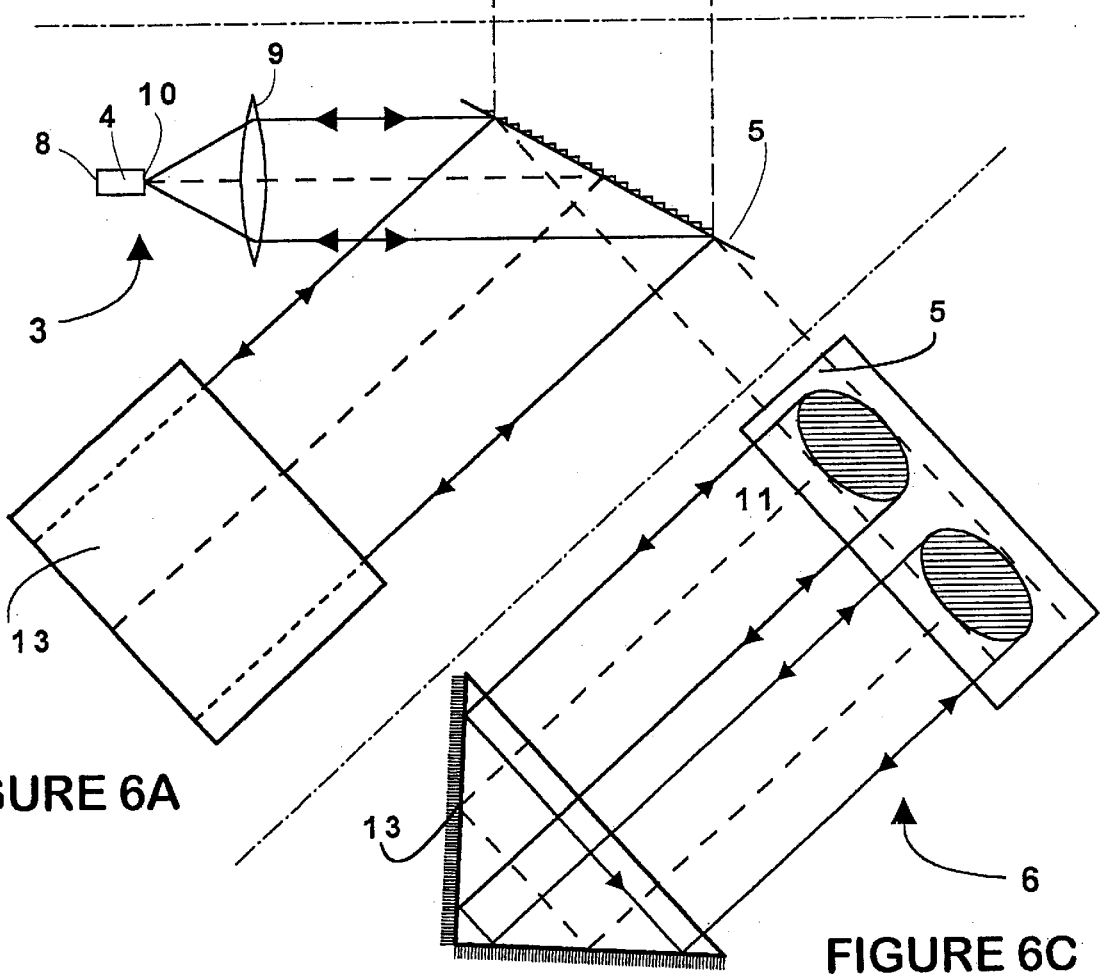
FIGURE 6A
FIGURE 6C

LASER SOURCE WITH INTEGRAL FILTERING OF THE AMPLIFIED SPONTANEOUS EMISSION

CROSS-REFERENCE TO RELATED APPLICATIONS

The present application claims priority under 35 U.S.C. §119 of French Patent Application No 99 08398 filed Jun. 30, 1999; the disclosure of which is expressly incorporated by reference herein in its entirety.

BACKGROUND OF THE INVENTION

1. Field of the Invention

This invention relates to a laser source fitted with a retroreflecting-dispersing system in the Littman-Metcalf configuration.

2. Discussion of Background Information

It is known to have retroreflecting-dispersing systems used in a manner to form one of the retroreflecting systems of a resonant laser cavity, in order to select spectrally one or some of the rays capable of being produced by the cavity.

By way of example, French patent FR-2.595.013 describes a monomode laser source of such type. The transmission wavelength is selected in the wide spectrum of an amplifier wave-guide with an external cavity comprising a retroreflecting dispersing system containing a diffraction grating. In the case of this prior art, a movement changing the angular orientation of the dispersing device enables varying the wavelength selected and transmitted by the laser source.

These laser sources implement a retroreflecting dispersing assembly in the so-called Littman-Metcalf configuration where the incident collimated beam delineates an angle $\theta_1$ with the normal line of the grating. An additional reflector is placed with its normal line describing an angle $\theta_2$ on the grating and the wavelength $\lambda$ which meets the condition $\lambda = \rho (\sin \theta_1 + \sin \theta_2)$ where $\rho$ is the step of the grating, is dispersed by the grating at an angle $\theta_2$, then retroreflected on the reflector that is then perpendicular to the former. Finally, it is dispersed again in the grating on the way back and comes out under the input angle $\theta_1$. The wavelength $\lambda$ is therefore selected by the cavity. It is possible to vary this wavelength $\lambda$ by varying the orientation of the grating-reflector assembly, i.e., by varying $\lambda 1$ or varying the orientation of the reflector only, i.e., by varying $\theta 2$ or still by varying the orientation of the grating only, i.e., by varying $\theta_1$ and $\theta 2$ while keeping $\theta_1 - \theta_2$ constant.

Such an external cavity laser source fitted with a retroreflecting dispersing system 2 in the Littman-Metcalf configuration is represented in FIG. 1 and may be described as comprising a first active arm 3 containing an amplifier guide 4, for example a semiconducting diode, a diffraction grating 5 and second passive arm 6 closed by a reflector 7.

The usual configuration of these sources uses the partially reflecting external face 8 of the diode 4 as an exit gate of the laser, and a total reflector then closes the second arm 6. This reflector can be a plane mirror or a dihedron, as illustrated in FIG. 2, ensuring one-dimension self-alignment of the cavity as described in French patent FR-2.595.013. Self-alignment is defined as the property of an optical system for which the properties of the outgoing luminous flux are minimally sensitive to the orientation or to the position of the system with respect to the incoming flux. Self-alignment can be performed on two dimensions, i.e., on all the planes parallel to the direction of the incoming beam or on a single dimension, i.e., on one of these planes only, the latter property being of special interest.

A collimation lens 9 formed by an optical system converging to the focus containing the internal face 10 of the amplifier wave guide 4, makes the beam emerging from this guide 4 parallel.

It has also been suggested to use the zero order of the grating 5 as an exit gate 8' with a totally reflecting external face 8 of the amplifier guide 4. In both cases, the transmitted light comes directly from the amplifier guide and comprises a laser ray with high spectral fineness associated with a residual wide band continuous background, that is called amplified spontaneous emission (ASE). The residual ASE power may reach several percent of the ray power, which brings a limitation in the tuneable laser spectroscopic applications. A filter tuned on the emission wavelength should then be added at the output, but wavelength synchronization of the filter on the emission wavelength of the source is very tricky.

SUMMARY OF THE INVENTION

The purpose of the invention is to improve such a source in order to filter the residual ASE of the output luminous beam of the cavity directly without any significant power loss and by avoiding the use of an additional tuned filter.

To this effect, the invention relates to an external cavity laser source with integral filtering of the amplified spontaneous emission fitted with a retroreflecting dispersing system in the Littman-Metcalf configuration comprising a first active arm extending from a first end reflector up to the grating and containing an amplifier medium that produces a first luminous beam, whereas a second passive arm extends from the grating to a second end reflector, wherein the grating generates a second beam by diffraction of the first beam.

According to the invention:

the reflector closing the second passive arm is partially reflecting and enables extraction of a luminous flux and, optical sources produce, from the second beam, a third beam translated and antiparallel to return to the grating which, by diffraction, forms a fourth beam translated and antiparallel to the first beam.

In different embodiments, each presenting specific advantages and capable of being combined according to numerous technically possible configurations:

the optical ASE filtering devices are placed in the path of the beam topped by the partially reflecting reflector of the second arm and sent back, after leaving the cavity, to the grating, in a direction parallel to that of the second arm; or the optical devices are placed in the second arm of the source that is folded parallel to itself, goes through the grating again and ends on the partially reflecting reflector;

the laser source comprises a wave-guide forming the amplifier medium and whose external face, entirely reflecting, terminates the first arm;

the laser source is wavelength tuneable by rotation of the reflector of the second arm;

the reflector is a partially reflecting optical component that produces from an incident beam, two secondary beams, one transmitted, the other reflected, having a first plane face that is entirely reflecting and a second plane face that is partially reflecting; the second face is perpendicular to the first, a third plane face is entirely reflecting, whereby the first and third faces are situated on the same plane; this component ensures one-dimension self-alignment of the reflected beam with the incident beam, whereby the beams respectively transmitted and reflected are each composed of two semi-beams with matching wave fronts;

the partially reflecting optical component is such that the first and the second faces are the faces of the same first prism and that the third face is carried by a second prism carrying a fourth face in contact with the second face of the first prism; preferably, both these prisms have the same refraction index;

the partially reflecting optical component comprises a fifth face parallel to the third face, whereas the transmitted beam is sent back parallel in the same direction as the incident beam;

the partially reflecting optical component comprises a fifth face parallel to the second face, whereas the transmitted beam is sent back parallel to the incident beam and in reverse direction;

the partially reflecting optical component is such that the first and second prisms are fixed to one another and form an integral block whereby the orientations of their faces with respect to one another are controlled, regardless of the prism to which they belong;

the partially reflecting optical component is such that one of the second and fourth faces exhibits a partially reflecting treatment.

A laser source according to the invention comprises a first active arm extending from first end reflector up to a dispersing system grating and containing an amplifier medium that produces a first luminous beam. A second passive arm extends from the grating to a second end reflector, the grating generating a second beam by diffraction of the first beam. The second end reflector closes the second passive arm and is partially reflecting to enable extraction of a luminous flux. An optical component produces from the second beam, a third beam translated and antiparallel, to return to the grating which, by diffraction, forms a fourth beam translated and antiparallel to the first beam.

Further, according to the invention, the laser source comprises an external cavity laser source. The laser source further comprises integral filtering of an amplified spontaneous emission. The source is fitted with a retroreflecting dispersing system. The dispersing system is in a Littman-Metcalf configuration.

According to a further aspect of the invention, the optical component is placed in the path of a beam tapped by the second end reflector and sent back after leaving the cavity, to the grating, in a direction parallel to that of the second arm. The beam tapped by the second end reflector comprises the second beam. The optical component is placed in the second arm is folded parallel to itself, goes through the grating again and ends on a partially reflecting reflector. The partially reflecting reflector comprises the second end reflector. The source comprises a wave-guide forming the amplifier medium and whose internal face include an antiglare coating placed at the focus of a collimation lens and whose external face, entirely reflecting terminates the first arm. The source is wavelength tuneable.

According to another aspect of the invention, the second end reflector comprises a first plane face that is entirely reflecting, a second plane face that is partially reflecting, the second face being perpendicular to the first face, and a third plane face that is entirely reflecting, wherein the first and third face are located in the same plane to ensure one-dimension self-alignment of the reflected beam with the incident beam, whereby the transmitted and reflected beams each comprise two semi-beams with matching wave fronts. The first and the second face are faces of the same first prism and the third face is carried by a second prism carrying a fourth face in contact with the second face of the first prism. The second end reflector comprises a fifth face parallel to the third face, the transmitted beam being sent back parallel in the same direction as the incident beam.

Further yet, the second end reflector comprises a fifth face parallel to the second face, the transmitted beam being sent back parallel to the incident beam and in a reverse direction. The first and second prisms are fixed to one another and form an integral block whereby the orientations of their faces with respect to one another are controlled, regardless of the prism to which they belong. One of the second and fourth faces exhibits a partially reflecting treatment.

According to yet another aspect of the invention an external cavity wavelength tuneable laser source with integral filtering of an amplified spontaneous emission fitted with a retroreflecting dispersing system in a Littman-Metcalf configuration comprises a first active arm extending from a first end reflector up to a dispersing system grating and containing an amplifier medium that produces a first luminous beam, a second passive arm extending from the grating to a second end reflector, the grating generating a second beam by diffraction of the first beam. The second end reflector closes the second passive arm and is, partially reflecting to enable extraction of a luminous flux. An optical component produces from the second beam a third beam translated and antiparallel, to return to the grating which, by diffraction, forms a fourth beam translated and antiparallel to the first beam. The optical component is placed in the path of the second beam which is sent back after leaving the cavity to the grating, in a direction parallel to that of the second arm. The second end reflector comprises a first plane face that is entirely reflecting, a second plane face that is partially reflecting, the second face being perpendicular to the first face, and a third plane face that is entirely reflecting, wherein the first and third faces are located in the same plane to ensure one-dimension self-alignment of the reflected beam with the incident beam whereby the transmitted and reflected beams each comprise two semi-beams with matching wave fronts. The first and the second faces are faces of the same first prism, the third face being carried by a second prism carrying a fourth face in contact with the second face of the first prism. The second end reflector comprises a fifth face parallel to the third face, the transmitted beam being sent back parallel in the same direction as the incident beam. The first and second prisms are fixed to one another and form an integral block whereby the orientations of their faces with respect to one another are controlled, regardless of the prism to which they belong with one of the second and fourth faces exhibiting a partially reflecting treatment.

BRIEF DESCRIPTION OF THE DRAWINGS

The invention will be described in greater detail with reference to the appended drawings wherein each figure is broken down into elevation and lateral views parallel to the first arm and to the second arm, respectively denominated A, B, C and in which:

FIGS. 3A, B and C are a schematic representation of a first embodiment of the invention;

FIGS. 4A, B and C are a particular case of the first embodiment of the invention with an optical component fulfilling the self-aligned partial reflection function;

FIGS. 5A, B and C are a representation of a second embodiment of the invention;

FIGS. 6A, B and C are a particular case of the second embodiment of the invention with an optical component fulfilling the self-aligned partial reflection function.

Figures 1A, 1B, 1C:
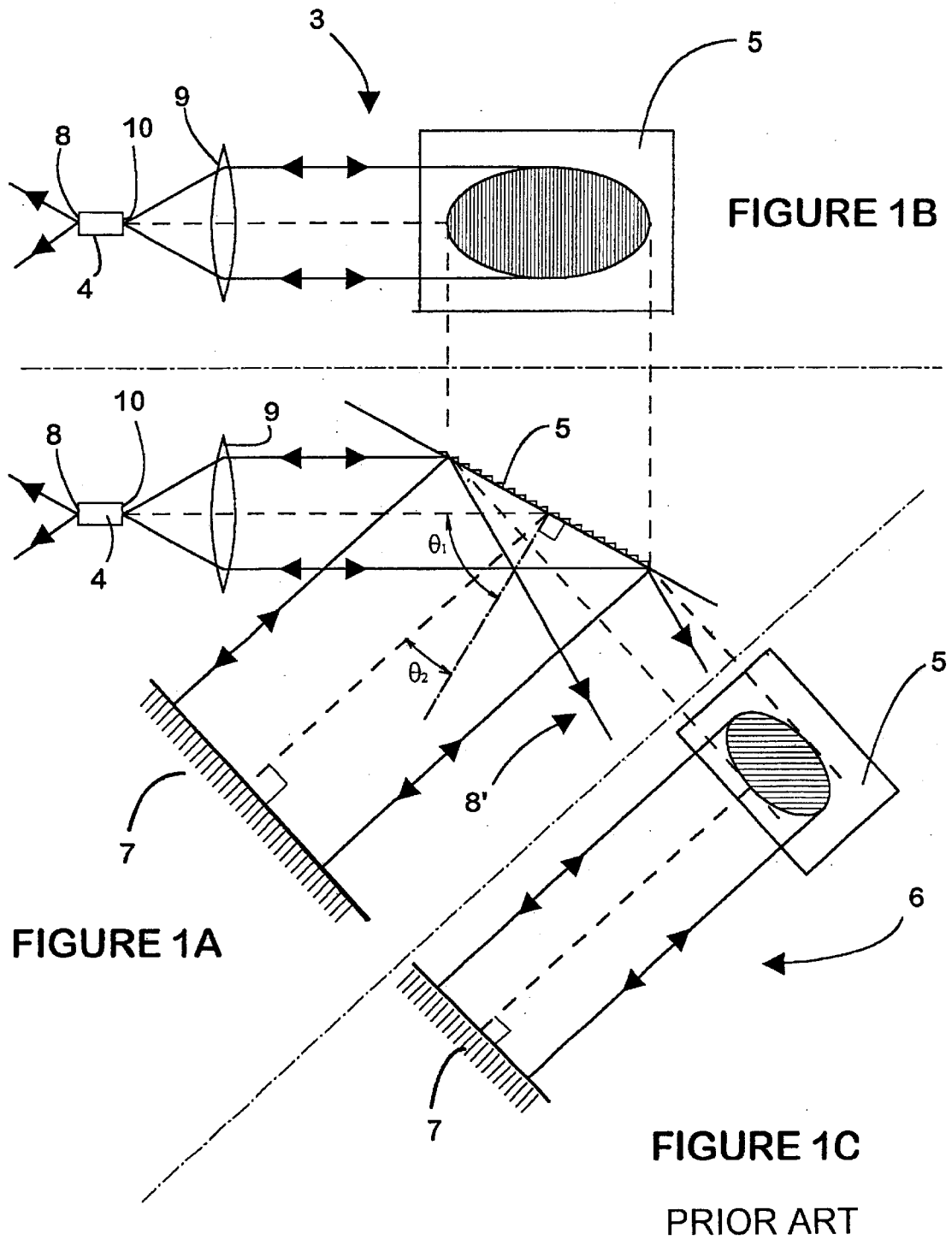
FIGS. 1A, B and C and 2A, B and C are representations of laser sources of the prior art.

On these various figures, the analogous components bear the same references.

DETAILED DESCRIPTION OF THE PRESENT INVENTION

The device of the invention generally comprises a cavity formed between the external face 8 of a laser diode 4 and a device at least partially reflecting. This cavity is composed of two arms, 3 and 6, respectively, and a grating 5 placed in the cavity which selects the emission wavelength. The internal face 10 of laser diode 4 includes an antiglare coating 10a.

The first arm 3 of the cavity means the optical path extending from the external face 3 of the amplifier medium, preferably a laser diode, serving as a first end reflector of the cavity of the laser source, up to the grating 5. The optical path extending from the grating 5 up to the second end reflector is called the second arm 6, regardless of its shape. Certain embodiments of the invention include one or several reflectors.

The laser beam 11 of the ASE filtered by a first pass over the grating 5 is sent back a second time to the grating, which produces an output beam 12 with constant direction, parallel to the first arm 3 of the cavity, regardless of the wavelength.

Thus, anamorphosis of the beam generated by its first pass over the grating is compensated for during the second pass. Moreover, the second pass improves rejection of the ASE over the grating.

In a first-embodiment illustrated in FIG. 3, this sending back of the beam onto the diffraction grating 5 is performed after extraction of the luminous flux from the laser cavity. The partially transparent blade 30 making up the second reflector of the external laser cavity sends back a portion of the beam 11 into the cavity and draws a portion to build the outgoing beam. The outgoing beam is then directed by the optical component 13 onto the grating 5 in a translated direction parallel to the second arm 6 of the laser cavity. The component 13 is preferably a dihedron ensuring one-dimension self-alignment of the beam emerging with respect to the incident beam. The outgoing flux is received by the grating at the angle corresponding to its wavelength and enabling its diffraction in a direction parallel to the first arm 3 of the cavity.

This diffraction of the flux leaving the grating ensures filtering of the ASE, enables compensation of the anamorphosis previously caused by this grating and maintains the direction of the emerging flux, including when the cavity is of the variable wavelength type, regardless of the wavelength.

Several variants of this first embodiment of the invention are possible.

FIG. 4 represents a preferred embodiment of such a device using an optical component 19 that comprises a first plane face 16 entirely reflecting, and a second plane face 17 partially reflecting and perpendicular to the first plane face 16. It also comprises a third plane face 18 entirely reflecting, contained in the same plane as the first plane face 16.

Figures 2A, 2B, 2C:
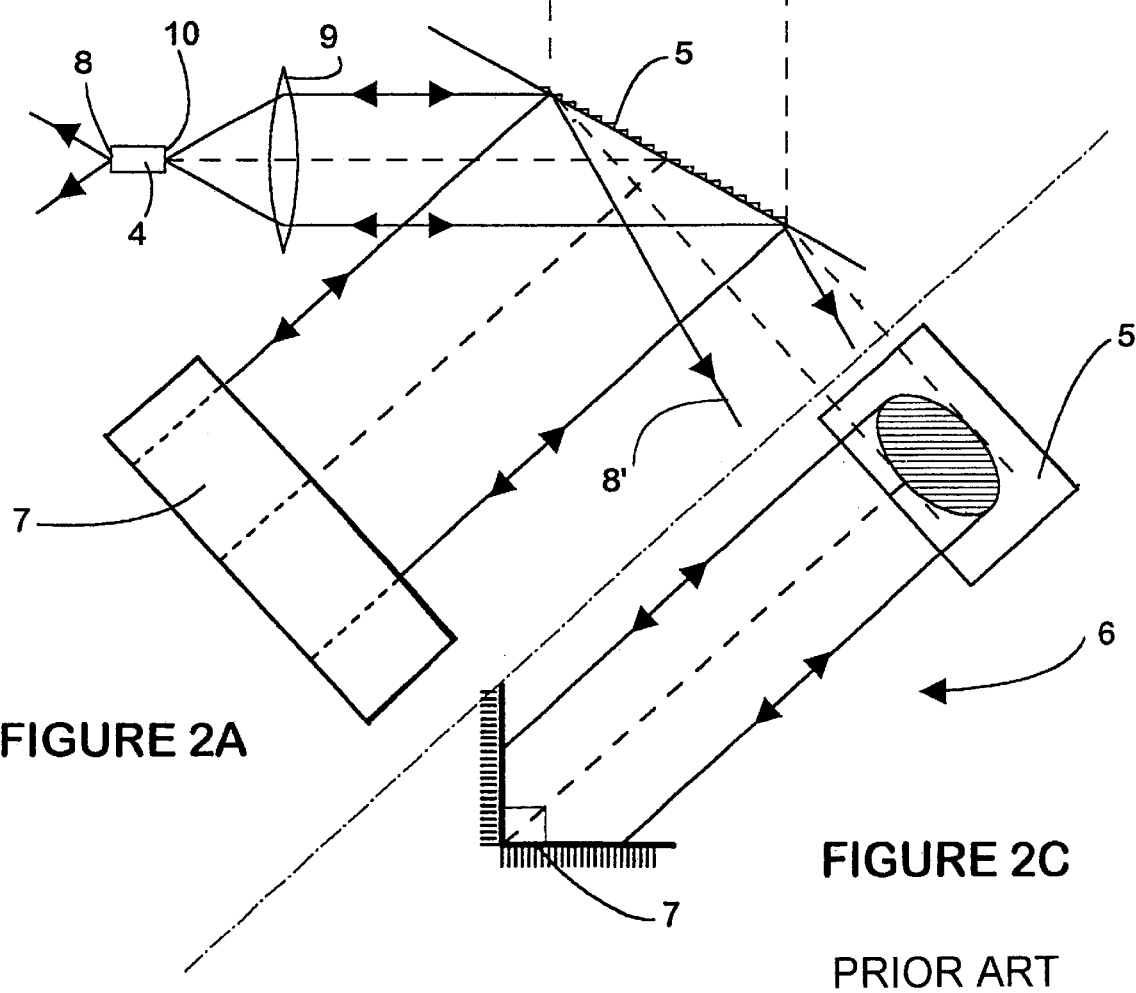

Thus, the retroreflecting beam 15 is formed of the incident beam 11 by two successive reflections, respectively on both perpendicular faces 16 and 17. It is known, and this has been described with reference to FIG. 2, that under such conditions, the angle formed by the beam 15 with the incident beam 11 is equal to 180°, is double the angle formed by both faces 16 and 17, i.e., this incident beam 11 is sent back parallel and in the direction opposite to the beam itself.

The beam 14 is itself formed by reflection on the first face 16 and the third face 18, which are coplanar. The component 19 comprises a fifth face 20 on which the emerging beam 14 is once again reflected. This face 20 is parallel to the second face 17 of the component and the direction of the emerging beam 14 is parallel and in reverse direction to that of the incident beam 11.

The optical component 19 thus fulfils both functions that are assigned to them, i.e., the production from an incident beam 11, on the one hand, of a one-dimension self-aligned reflected beam 15 and, on the other hand, of a transmitted beam 14, sent back on the grating in a direction parallel to the incident beam.

The energy ratio between the beam 11 and the beam 14 depends on the reflection ratio of the partially reflecting face 17.

Advantageously, the first and second faces 16 and 17 are the faces of a first prism and the third face 18 is carried by another prism that has a fourth face in contact with the second face 17 of the first prism and a fifth face 20.

Both emerging beams 14 and 15 produced by this component are formed of two semi-beams, each in phase with the other, i.e., for the retroreflected beam 15, the wave fronts of both semi-beams $15_1$ and $15_2$ match. The same goes for the semi-beams $14_1$ and $14_2$ forming the extracted beam 14. In other words, the input beam 11 is cut by this component, whereas both semi-beams $15_1$ and $15_2$ form respectively both retroreflected semi-beams and the extracted semi-beams $14_1$ and $14_2$. The semi-beams $15_1$, and $15_2$ on the one hand and $14_1$, and $14_2$ on the other, are phased, their wave fronts match, which enables them to be recoupled efficiently in a monomode fiber or a monomode wave-guide.

In a second embodiment described in FIG. 5, the amplified luminous flux 11 is sent back a second time to the grating before its extraction from the cavity. A total self-aligned reflector 13 is then placed on the second arm 6 of the cavity to send back the amplified luminous flux in a direction parallel and reverse to the direction of the incident beam 11. Thus, the angle of incidence of the beam and the grating 5, during its second pass, is the same as that of the first pass.

The extraction of the luminous flux is then performed by a partially reflecting component made of, either a partially reflecting lame 25 or as in the preferred embodiment presented in FIG. 6, by a self-aligned partially reflecting optical component 26 similar to that already described above that fulfils the one-dimension self-aligned retroreflection function as well as the extraction of a portion of the beam. In this embodiment, this component 26 has its entirely reflecting faces 16, 18 and 27 parallel, whereas the output flux has the same direction as the incident flux.

What is claimed is:

1. A laser source comprising:
    a first active arm extending from a first end reflector up to a dispersing system grating and containing an amplifier medium that produces a first luminous beam;
    a second passive arm extending from the grating to a second end reflector, said grating generating a second beam by diffraction of the first beam, wherein the second end reflector closes the second passive arm and is partially reflecting to enable extraction of a luminous flux; and an optical component to produce, from the second beam, a third beam translated and antiparallel, to return to the grating which, by diffraction, forms a fourth beam translated and antiparallel to the first beam.

2. The laser source according to claim 1, wherein the laser source comprises an external cavity laser source.

3. The laser source according to claim 2, further comprising integral filtering of an amplified spontaneous emission.

4. The laser source according to claim 3, wherein the source is fitted with a retroreflecting dispersing system.

5. The laser source according to claim 4, wherein the dispersing system is in a Littman-Metcalf configuration.

6. The laser source according to claim 2, wherein said optical component is placed in the path of a beam tapped by the second end reflector and sent back, after leaving the cavity, to the grating, in a direction parallel to that of the second arm.

7. The laser source according to claim 6, wherein the beam tapped by the second end reflector comprises said second beam.

8. The laser source according to claim 1, wherein said optical component is placed in the second arm, is folded parallel to itself, goes through the grating again and ends on a partially reflecting reflector.

9. The laser source according to claim 8, wherein said partially reflecting reflector comprises said second end reflector.

10. The laser source according to claim 9, wherein said source comprises a wave-guide forming the amplifier medium and whose internal face includes an antiglare coating placed at the focus of a collimation lens, and whose external face, entirely reflecting, terminates said first arm.

11. The laser source according to claim 1, wherein said source comprises a wave-guide forming the amplifier medium and whose internal face includes an antiglare coating placed at the focus of a collimation lens, and whose external face, entirely reflecting, terminates said first arm.

12. The laser source according to claim 1, wherein said source is wavelength tuneable.

13. The laser source according to claim 1, wherein the second end reflector comprises:

a first plane face that is entirely reflecting;

a second plane face that is partially reflecting, the second face being perpendicular to the first face; and a third plane face that is entirely reflecting, wherein the first and third faces are located in the same plane to ensure one-dimension self-alignment of the reflected beam with the incident beam, whereby the transmitted and reflected beams, each comprise two semi-beams with matching wave fronts.

14. The laser source according to claim 13, wherein the first and the second faces are faces of the same first prism, and that the third face is carried by a second prism carrying a fourth face in contact with the second face of the first prism.

15. The laser source according to claim 14, wherein the second end reflector comprises a fifth face parallel to the third face, the transmitted beam being sent back parallel in the same direction as the incident beam.

16. The laser source according to claim 14, wherein the second end reflector comprises a fifth face parallel to the second face, the transmitted beam being sent back parallel to the incident beam and in a reverse direction.

17. The laser source according to claim 14, wherein the first and second prisms are fixed to one another and form an integral block whereby the orientations of their faces with respect to one another are controlled, regardless of the prism to which they belong.

18. The laser source according to claim 14, wherein one of the second and fourth faces exhibits a partially reflecting treatment.

19. An external cavity wavelength tuneable laser source with integral filtering of an amplified spontaneous emission fitted with a retroreflecting dispersing system in a Littman-Metcalf configuration comprising:

a first active arm extending from a first end reflector up to a dispersing system grating and containing an amplifier medium that produces a first luminous beam;

a second passive arm extending from the grating to a second end reflector, said grating generating a second beam by diffraction of the first beam, wherein the second end reflector closes the second passive arm and is partially reflecting to enable extraction of a luminous flux; and an optical component to produce, from the second beam, a third beam translated and antiparallel, to return to the grating which, by diffraction, forms a fourth beam translated and antiparallel to the first beam;

said optical component being placed in the path of the second beam which is sent back, after leaving the cavity, to the grating, in a direction parallel to that of the second arm;

the second end reflector comprising a first plane face that is entirely reflecting, a second plane face that is partially reflecting, the second face being perpendicular to the first face, and a third plane face that is entirely reflecting, wherein the first and third faces are located in the same plane to ensure one-dimension self-alignment of the reflected beam with the incident beam, whereby the transmitted and reflected beams, each comprise two semi-beams with matching wave fronts;

the first and the second faces being faces of the same first prism, the third face being carried by a second prism carrying a fourth face in contact with the second face of the first prism, the second end reflector comprising a fifth face parallel to the third face, the transmitted beam being sent back parallel in the same direction as the incident beam, the first and second prisms being fixed to one another and forming an integral block whereby the orientations of their faces with respect to one another are controlled, regardless of the prism to which they belong, one of the second and fourth faces exhibiting a partially reflecting treatment.

20. An external cavity wavelength tuneable laser source with integral filtering of an amplified spontaneous emission fitted with a retroreflecting dispersing system in a Littman-Metcalf configuration comprising:

a first active arm extending from a first end reflector up to a dispersing system grating and containing an amplifier medium that produces a first luminous beam;

a second passive arm extending from the grating to a second end reflector, said grating generating a second beam by diffraction of the first beam, wherein the second end reflector closes the second passive arm and is partially reflecting to enable extraction of a luminous flux; and an optical component to produce, from the second beam, a third beam translated and antiparallel, to return to the grating which, by diffraction, forms a fourth beam translated and antiparallel to the first beam, wherein said optical component is placed in the second arm, is folded parallel to itself, goes through the grating again and ends on a partially reflecting reflector, said partially reflecting reflector comprising said second end reflector, said source comprising a wave-guide forming the amplifier medium and whose internal face includes an antiglare coating placed at the focus of a collimation lens, and whose external face, entirely reflecting, terminates said first arm.

21. An external cavity wavelength tuneable laser source with integral filtering of an amplified spontaneous emission fitted with a retroreflecting dispersing system in a Littman-Metcalf configuration comprising:

a first active arm extending from a first end reflector up to a dispersing system grating and containing an amplifier medium that produces a first luminous beam;

a second passive arm extending from the grating to a second end reflector, said grating generating a second beam by diffraction of the first beam, wherein the second end reflector closes the second passive arm and is partially reflecting to enable extraction of a luminous flux; and an optical component to produce, from the second beam, a third beam translated and antiparallel, to return to the grating which, by diffraction, forms a fourth beam translated and antiparallel to the first beam;

said optical component being placed in the path of the second beam which is sent back, after leaving the cavity, to the grating, in a direction parallel to that of the second arm, the second end reflector comprising a first plane face that is entirely reflecting, a second plane face that is partially reflecting, the second face being perpendicular to the first face, and a third plane face that is entirely reflecting, the first and third faces being located in the same plane to ensure one-dimension self-alignment of the reflected beam with the incident beam, whereby the transmitted and reflected beams, each comprise two semi-beams with matching wave fronts, the first and the second faces being faces of the same first prism, and the third face being carried by a second prism carrying a fourth face in contact with the second face of the first prism, the second end reflector comprising a fifth face parallel to the second face, the transmitted beam being sent back parallel to the incident beam and in a reverse direction, the first and second prisms being fixed to one another and forming an integral block whereby the orientations of their faces with respect to one another are controlled, regardless of the prism to which they belong, one of the second and fourth faces exhibiting a partially reflecting treatment.

* * * * *